(12) United States Patent
Byquist

(10) Patent No.: US 6,916,195 B2
(45) Date of Patent: Jul. 12, 2005

(54) LAND GRID ARRAY SOCKET LOADING DEVICE

(75) Inventor: Tod A. Byquist, Tukwila, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/400,815

(22) Filed: Mar. 26, 2003

(65) Prior Publication Data

US 2004/0192074 A1 Sep. 30, 2004

(51) Int. Cl.[7] .............................................. H01R 13/625
(52) U.S. Cl. ........................ 439/342; 439/73; 439/331
(58) Field of Search ............................ 439/70, 73, 266, 439/267, 331, 342, 372

(56) References Cited

U.S. PATENT DOCUMENTS

| 5,482,471 | A | * | 1/1996 | Mori et al. ................. 439/263 |
| 5,919,259 | A | * | 7/1999 | Dahl .......................... 713/300 |
| 6,191,480 | B1 | | 2/2001 | Kastberg et al. |
| 6,205,026 | B1 | | 3/2001 | Wong et al. |
| 6,283,782 | B1 | | 9/2001 | Yahiro et al. |
| 6,485,320 | B1 | | 11/2002 | Ma |
| 6,679,709 | B2 | | 1/2004 | Takeuchi |
| 6,685,494 | B1 | * | 2/2004 | McHugh et al. ............ 439/342 |
| 6,692,279 | B1 | * | 2/2004 | Ma ............................. 439/331 |

* cited by examiner

Primary Examiner—Tho D. Ta
Assistant Examiner—James R. Harvey
(74) Attorney, Agent, or Firm—Blakely, Sokoloff, Taylor & Zafman LLP

(57) ABSTRACT

A method and an apparatus for removably retaining an IC in engagement with a socket such that contacts carried by the package of the IC are pressed into engagement with contacts carried by the socket by way of a retention frame with ledges positioned opposite corresponding ledges of the socket and both a load plate and load lever pivotally connected to the retention frame.

9 Claims, 17 Drawing Sheets

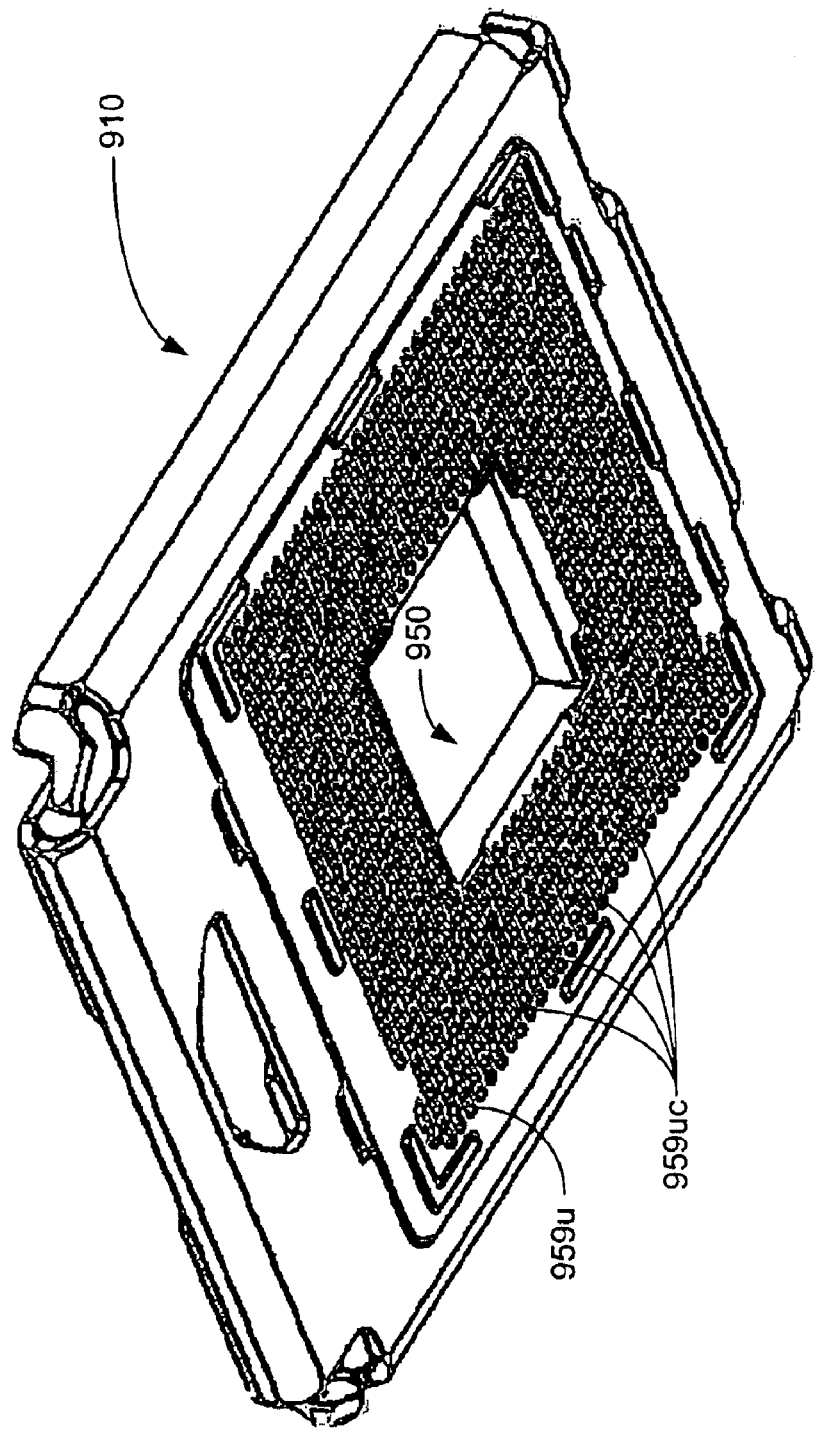

LAND GRID ARRAY SOCKET LOADING DEVICE

FIELD OF THE INVENTION

An apparatus for retaining an IC device encapsulated within a land grid array package in electrical contact with a socket.

ART BACKGROUND

As part of continuing efforts to increase the functionality of integrated circuits (ICs) such as central processing units (CPUs), there has been a continuing need to provide ever more electrical contacts (commonly referred to as "pins") on the packages in which ICs are typically encapsulated to enable ever greater interactions between such ICs and other devices. However, increasing the number of electrical connections for a given IC presents the challenge of finding a way to accommodate having an increasing number of contacts mounted on an IC package in a way that will still afford a practical way to attach the IC package (and thereby, attach the IC within) to a circuitboard so that electrical connections with other devices are created.

In answer to this increasing need to provide more electrical contacts for use by an IC, various forms of through-hole pins, surface mount contacts, solder leaf contacts, solder balls, etc. have been devised over time. Where the IC is meant to be permanently attached to a circuitboard, it is possible to devise a layout of electrical contacts on at least one surface of the IC package that will permit those contacts to be soldered to a surface of a circuitboard.

However, there are other situations where the IC must be removably attached to a circuitboard such that an unskilled user of a product in which the circuitboard is installed must be able to attach or detach the IC from the circuitboard without the benefit of a host of specialized tools. In such situations, it is seldom deemed acceptable or desirable to require such a user to solder or desolder an IC encapsulated within a package having a very large number of contacts, and so the use of a socket by which the IC may be removably attached to a circuitboard must be provided for.

Sockets have been devised to support for removably attaching an IC with a PGA package to a circuitboard. However, the use of pins in by a PGA package of an IC requires that the socket be designed to "grab" the pins with opposing forces sideways along the lengths of the pins to make electrical connections. This requires mechanisms within the socket that limits the possible density of pins and thereby limits the overall practical number of pins on a given package that may be supported. It would be desirable to provide a socket that did not use pins, and therefore, did not require such mechanisms within a socket to use sideways forces.

Sockets could be provided that would rely on contacts of the socket being pressed against corresponding contacts as a result of the package of an IC being pressed against the socket. Unfortunately, the pressure required to press each pin of a socket against each corresponding pin of a package requires a certain quantity of force to ensure a good electrical connection, and this pressure is cumulative, such that the amount of force required goes up with the number of pairs of corresponding contacts that must be pressed together. This cumulative amount of force can pose various mechanical design challenges, including the need to evenly spread the force across all of the corresponding pairs of pins to ensure that each receives the required amount of force without receiving an excessive quantity of force. Where very large numbers of corresponding pairs of pins are involved, causing a great deal of cumulative force to be required, concerns arise about ensuring the even application of force so as to not physically damage either the socket or the package of the IC.

BRIEF DESCRIPTION OF THE DRAWINGS

The objects, features, and advantages of the invention as hereinafter claimed will be apparent to one skilled in the art in view of the following detailed description in which:

FIGS. 9d, 9e and 9f depict placement of electrical contacts in the embodiment of FIGS. 9a, 9b and 9c.

DETAILED DESCRIPTION

Although numerous details are set forth for purposes of explanation and to provide a thorough understanding in the following description, it will be apparent to those skilled in the art that these specific details are not required in order to practice embodiments of the invention as hereinafter claimed. For example, although embodiments are discussed with reference to an IC device having a package with land grid array (LGA) contacts, it will be readily apparent to those skilled in the art that other embodiments having other types of contacts may be employed without departing from the spirit and scope of the invention as hereinafter claimed.

Apparatus for removably retaining an IC package in engagement with a socket such that the contacts of both the IC package and the socket are properly engaged is disclosed. Specifically, a frame that engages a socket and a load plate that engages an IC package are caused to press the socket and IC package together through force selectively applied through the use of a load lever.

Figure 1:
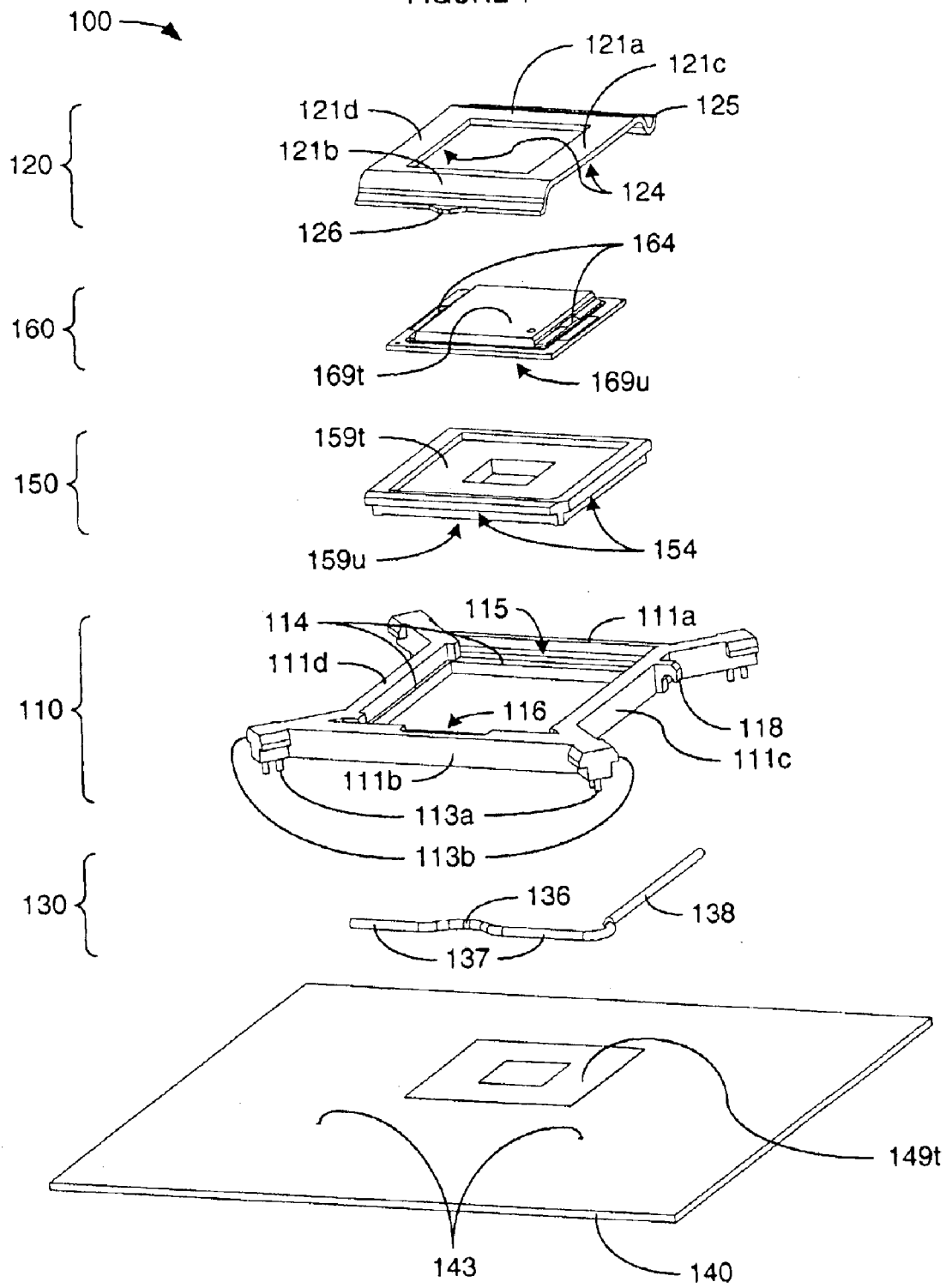
FIG. 1 depicts an embodiment of an assembly of an IC and a socket.

FIG. 1 depicts an embodiment of an assembly of an IC to a socket. Assembly 100 is made up of retention frame 110, load plate 120, load lever 130, circuitboard 140, socket 150 and IC 160. Retention frame 110, load plate 120 and load lever 130 cooperate to forcibly press together IC 160 and socket 150 so as to press contacts on topside 159t of socket 150 into engagement with contacts on underside 169u of IC 160.

In preparation for assembly, load lever 130 is positioned between retention frame 110 and circuitboard 140, aligning axle portions 137 of load lever 130 with a load lever channel (not shown) formed in frame portion 111b of retention frame 110, and aligning load point 136 of lever 130 to ultimately protrude through load point channel 116 formed through portion 111b of retention frame 110. Retention frame 110 attaches to circuitboard 140 via fasteners 113a of retention frame 110 engaging mounting holes 143 of circuitboard 140, and trapping load lever 130 within the load lever channel of retention frame 110 and between retention frame 110 and circuitboard 140.

Socket 150 attaches to circuitboard 140 via any of a number of known techniques for soldering contacts on underside 159u of socket 150 to contacts on socket surface location 149t of circuitboard 140. As socket 150 is attached to circuitboard 140, socket 150 is positioned amidst the open area formed through the middle of retention frame 110 that is outlined by frame portions 11a through 111d, and ledges 154 of socket 150 are positioned opposite ledges 114 of retention frame 110.

IC 160 is positioned between load plate 120 and socket 150, aligning contacts on underside 169u of IC 160 with corresponding contacts on topside 159t of socket 150, and aligning raised topside 169t of IC 160 with the opening formed through load plate 120 that is outlined by plate portions 121a through 121d. Load plate 120 and IC 160 are also aligned to allow load points 124 on plate portions 121c and 121d of load plate 120 to engage load points 164 surrounding raised topside 169t of IC 160. Raised topside 169t is raised relative to load points 164 such that raised topside 169t protrudes through the opening formed through load plate 120 when load points 124 and 164 are engaged in contact with each other. In various embodiments, the actual circuitry of IC 160 is located on a surface of a ceramic die within the package of IC 160 at a location generally centered behind raised topside 169t, and the placement of load points 164 at locations surrounding raised topside 169t aid in avoiding the application of force exerted by load plate 120 against topside 169t (which may be more fragile than load points 164), thereby avoiding the possibility of damaging the circuitry of IC 160. The protrusion of topside 169t through the opening formed through load plate 120 also allows a heatsink or other cooling device to be positioned in contact with topside 169t and clear of any obstruction that my be posed by load plate 120 such that heat generated by circuitry within IC 160 may be conducted away through topside 169t. Load plate 120 attaches to retention frame 110, in part, via hinge lip 125 on plate portion 121a of load plate 120 engaging hinge channel 115 formed in frame portion 111a of retention frame 110, and trapping IC 160 between load plate 120 and socket 150.

Load lever 130 is pivoted about the common axis of axle portions 137 of load lever 130, causing load point 136 of load lever 130 to engage load point 126 on plate portion 121b of load plate 120 and so that lever handle 138 engages lever catch 118 of socket 110. The engagements between hinge lip 125 and hinge channel 115, between load point 136 and load point 126, between ledges 154 and 114, and between load points 124 and load points 164 cooperate to exert forces normal to both underside 169u of IC 160 and topside 159t that press underside 169u against topside 159t such that contacts on both underside 169u and topside 159t are pressed into engagement with each other, forming electrical connections therebetween.

The positioning of ledges 154 and 114 on all sides of socket 150 where socket 150 is surrounded by retention frame 114 allows retention frame 110 to stiffen socket 150 and thereby aid in preventing socket 150 from bending or otherwise curving in reaction to the forces used in pressing socket 150 and IC 160 together. Stiffening socket 150 aids in ensuring that the forces pressing underside 169u of IC 160 against topside 159t of socket 150 are distributed evenly across underside 169u and topside 159t so that all pins on underside 169u are being pressed against corresponding pins on topside 159t with equal amounts of force. The stiffening of socket 150 may be further aided by the attachment of retention frame 110 to circuitboard 140 via fasteners 113a engaging mounting holes 143, allowing retention frame 110 to be strengthened against bending, itself, although the degree to which retention frame 110 draws strength from this attachment to circuitboard 140 may have to be limited to ensure that not so much force is transmitted to the attachment between fasteners 113a and mounting holes 143 that creeping failures are caused to occur such that the ability of fasteners 113a to aid in supporting the attachment of cooling devices to fasteners 113b is compromised.

In some embodiments, retention frame 110 may be designed with a physical stop in the vicinity of load point channel 116 to limit the degree to which load plate 120 may be pressed towards socket 150, and thereby limit the force exerted by load plate 120 at load points 124 against IC 160 at load points 164 in order to protect against inadvertent damage to IC 160. In some embodiments, load lever 130 may be fabricated in such a way that there is sufficient flexibility in the material of load lever 130 such that load point 136 may flex to some limited degree relative to load handle 138 on the common axis of axle portions 137 in order to provide some wider tolerances to accommodate instances where load point 136 engages load point 126 and has effectively already pressed load plate 120 as far as load plate 120 either could or should go before load handle 138 has yet engaged lever catch 118.

Figure 2A:
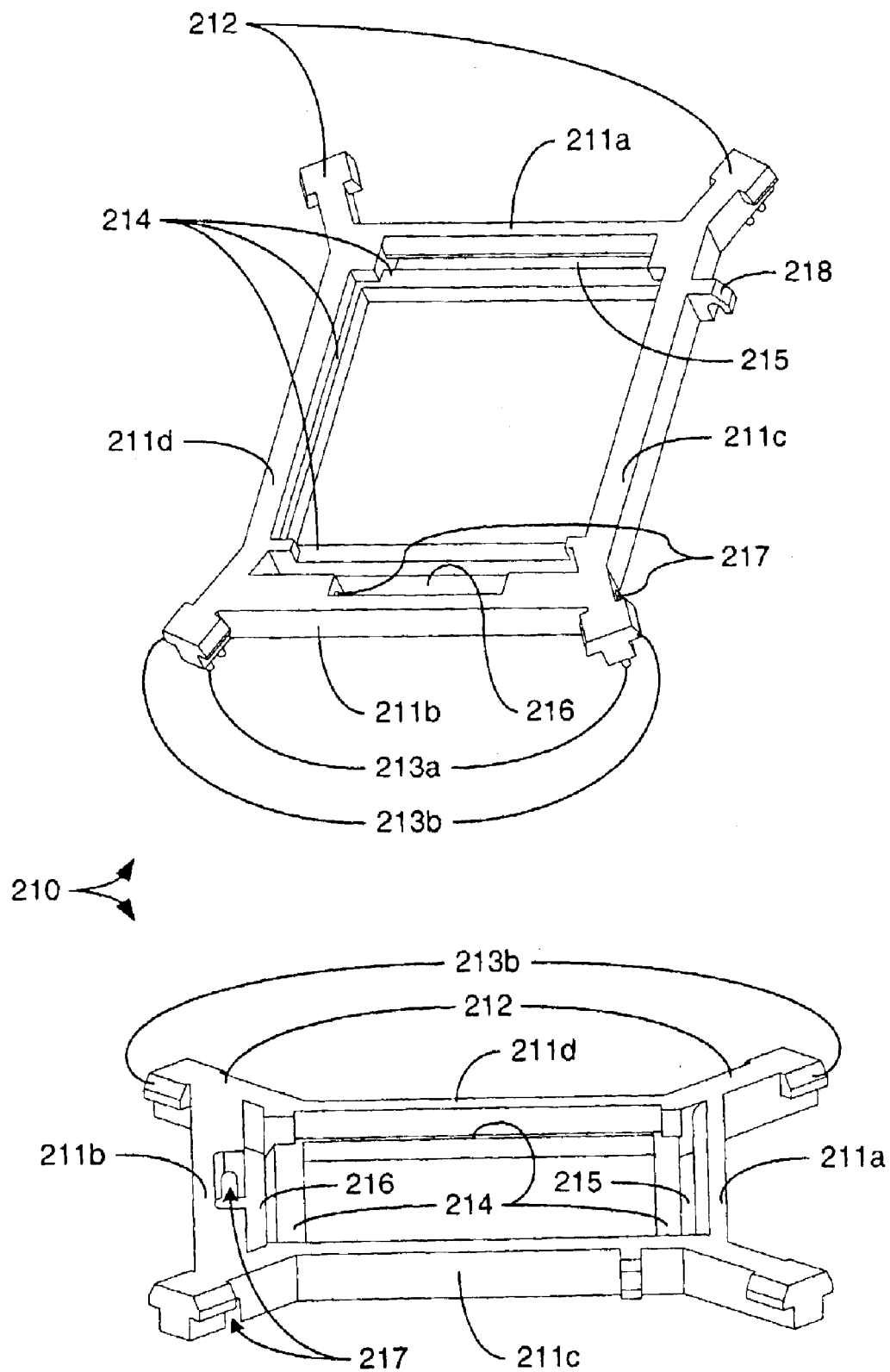
FIGS. 2a, 2b and 2c depict an embodiment of IC retention hardware.
Figure 2B:
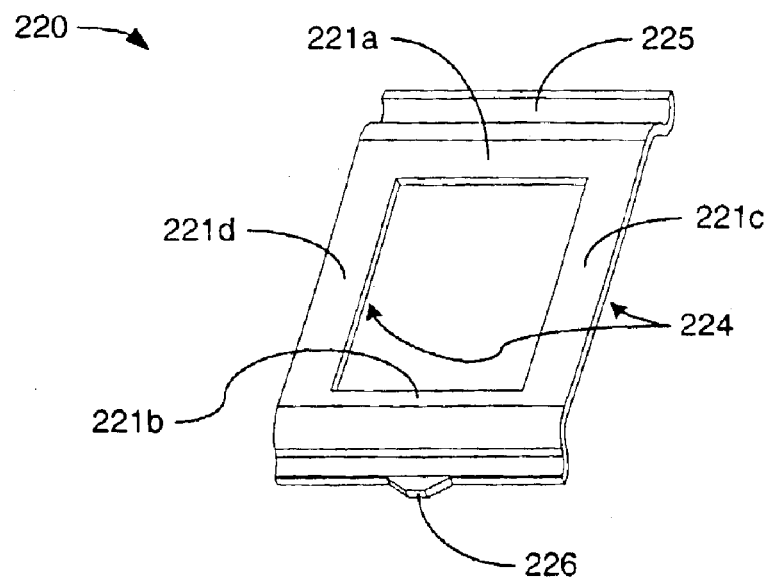
Figure 2C:
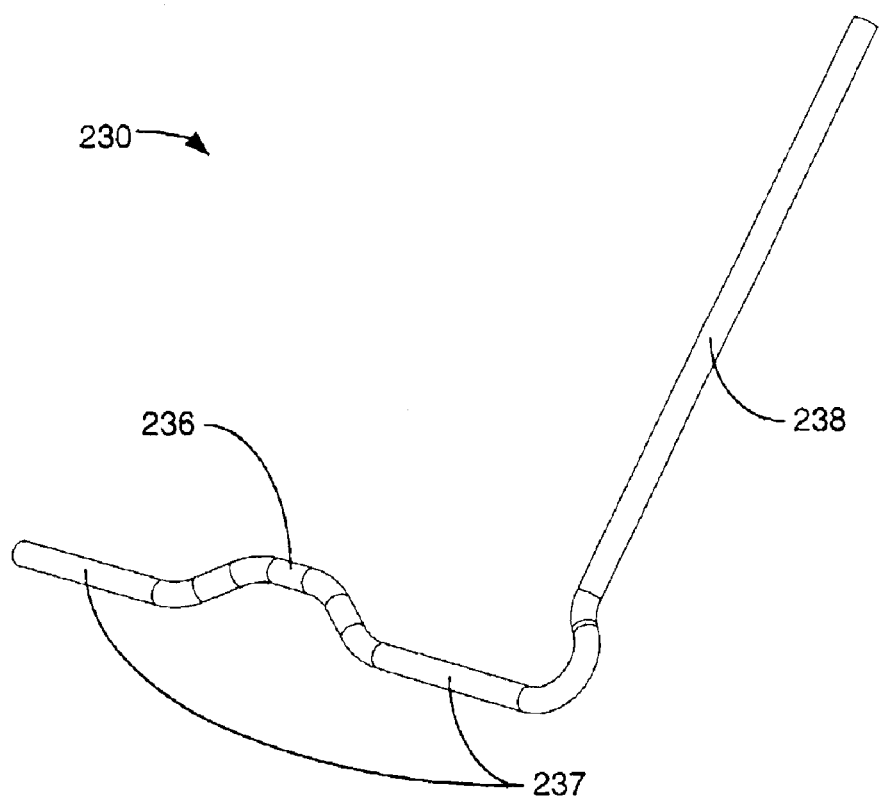

FIGS. 2a–c depict an embodiment of hardware for removably retaining an IC. As an aid to understanding and relating what is depicted in FIGS. 2a–c to what is depicted in FIG. 1, the latter two digits of labels 2xx of FIGS. 2a–c are meant to generally correspond to the latter two digits of labels 1xx of FIG. 1. In a manner not unlike what was depicted in FIG. 1, retention frame 210, load plate 220 and load lever 230 cooperate to removably retain an IC in engagement with a socket attached to a circuitboard (IC, socket and circuitboard not shown).

Retention frame 210 is generally made up of frame portions 211a–d forming a generally rectangular frame with a rectangular opening therethrough, and frame portions 212 at each of the corners of that rectangle. Each of frame portions 211a–d provide one of ledges 214 to engage corresponding ledges of a socket and forming part of the edge of the rectangular opening outlined by frame portions 211a–d. Hinge channel 215 is provided by frame portion 211a to engage hinge lip 225 of load plate 220 when hinge lip 225 is inserted into hinge channel 215. Load point channel 216 and lever channel 217 are provided by frame portion 211b to provide a location into which load point 236 and axle portions 237 of load lever 230 are meant to be inserted such that axle portions 237 rotatably rest within lever channel 217 and load point 236 protrudes through load point channel 216.

Each of frame portions 212 carry fasteners 213a to attach retention frame 210 to a circuitboard, and fasteners 213b to enable attachment and positioning of a cooling device (not shown) in engagement with a topside surface of a removably retained IC to cool that IC. Although fasteners 213a are depicted as being through-hole for attachment by protruding through and being soldered within holes formed through a circuitboard, those skilled in the art of the mounting of components to a circuitboard will readily recognize that in various possible embodiments, fasteners 213a may be of any of a variety of types including, but not limited to, rivets, screws or other threaded fasteners, jagged-edged boardlocks, etc.

Load plate 220 is generally made up of plate portions 221a–d forming a generally rectangular plate with a rectangular opening therethrough. Hinge lip 225 is carried by plate portion 221a to engage hinge channel 215 of retention frame 210, as previously described. Load point 226 is provided by plate portion 221b to protrude into the vicinity of load point channel 216 of retention frame 210 when hinge lip 225 has been inserted into hinge channel 215, and load plate 220 has been pivoted towards retention frame 210 on the hinge created by the combination of hinge lip 225 and hinge channel 215. In various possible embodiments, at least hinge lip 225 and/or load point 226 of load plate 220 may be fabricated of spring metal or any of a variety of other materials providing similar flexibility.

Plate portions 221c and 221d provide load points 224 to engage corresponding load points surrounding a raised topside of an removably retained IC. In one embodiment, plate portions 221c and 221d are generally of one plane such that load points 224 are each generally made up of an entire surface of each of plate portions 221c and 221d. In such an embodiment, it may be that all four of plate portions 221c and 221d form a common plane, and therefore, load points 224 may be generally made up of a common surface extending all about all four of plate portions 221a–d such that a removably retained IC is engaged at load points in a rectangular layout generally following the rectangular shape formed by plate portions 221a–d. In another embodiment, plate portions 221c and 221d may be curved such that load points 224 are each at the outward-most bow of the curve of each of plate portions 221c and 221d such that a removably retained IC is engaged at load points covering a minimal amount of surface area of that IC. In such an embodiment, as well as other possible embodiments, at least plate portions 221c–d may be fabricated from spring metal or any of a variety of materials providing similar flexibility. In still another embodiment, load points 224 are dimples or other form of protrusion formed in or carried by each of plate portions 221c–d to such that a removably retained IC is engaged at load points only at minimal specific locations on the package of that IC.

Load lever 230 is a largely L-shaped rod made up of lever handle 238 making up one leg of the "L" shape, and both axle portions 237 and load point 236 making up the other leg of the "L" shape. Axle portions 237 are separated by load point 236, but share a common axis around which load lever 230 is meant to be rotated after being inserted into lever channel 217 of retention frame 210, as previously discussed. This insertion of load lever 230 into lever channel 217 places load lever 230 in a position to be rotated about the common axes of axle portions 237 to cause load point 236 to engage load point 226 of load plate 220 in the vicinity of load point channel 216 after load plate 220 has been pivoted towards retention frame 210, as previously discussed. Lever handle 238 provides a mechanism by which this rotation may be effected while providing mechanical leverage for exerting a force through load point 236 when load point 236 engages load point 226. This engagement of load point 236 with load point 226 and the engagement of hinge lip 225 with hinge channel 215 are meant to cooperate to retain and press load plate 220 against retention frame 210 as part of removably retaining an IC.

Figure 3A:
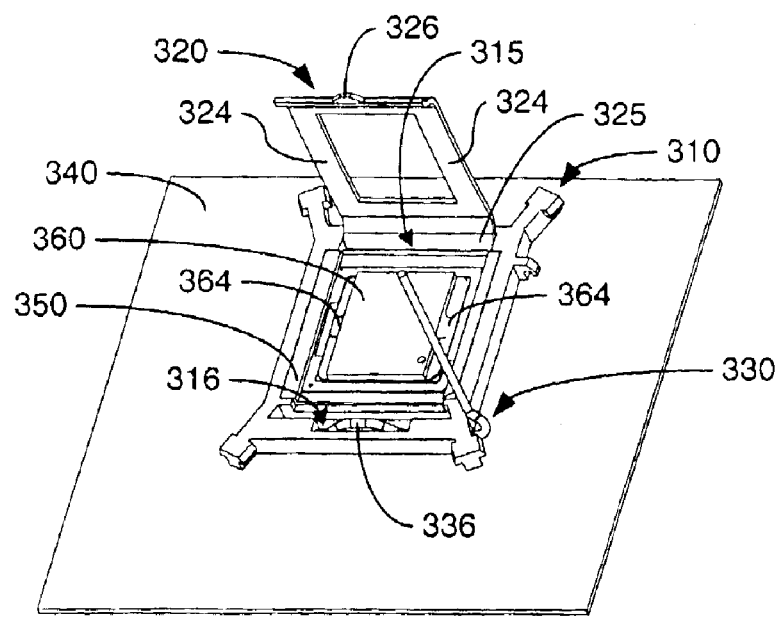
FIGS. 3a, 3b and 3c depict an embodiment of installing an IC in a socket.
Figure 3B:
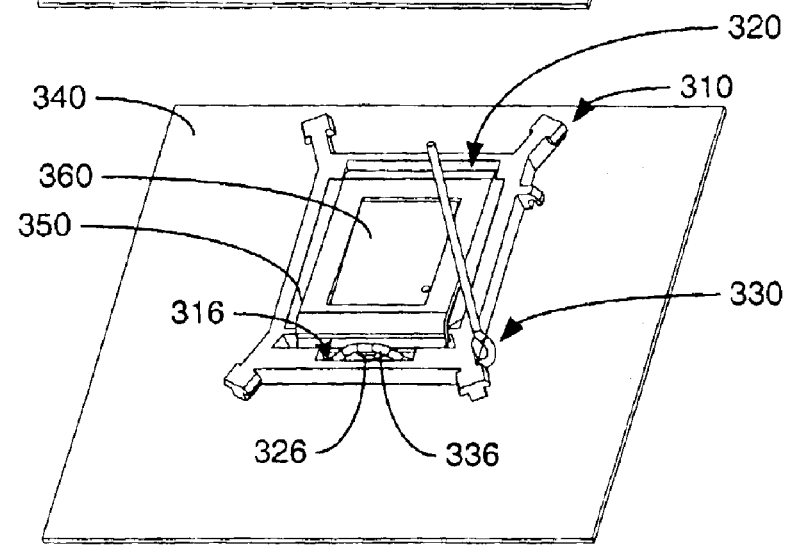
Figure 3C:
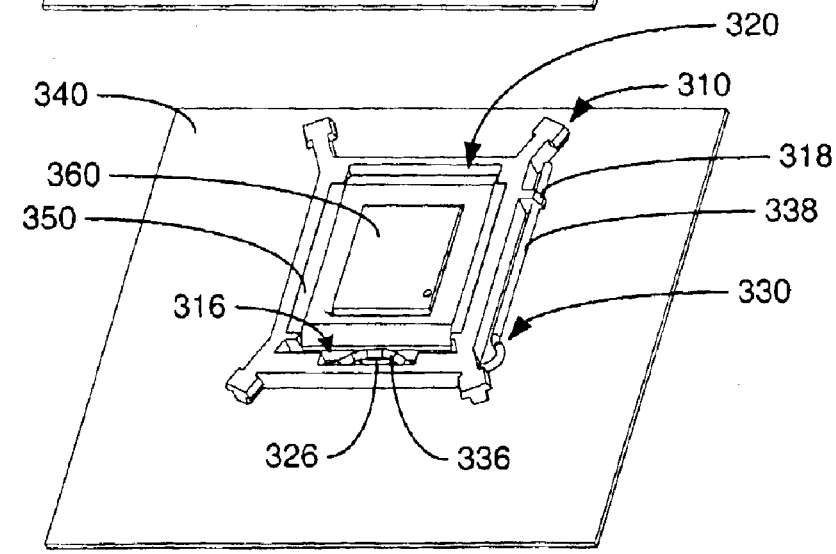
Figure 3D:
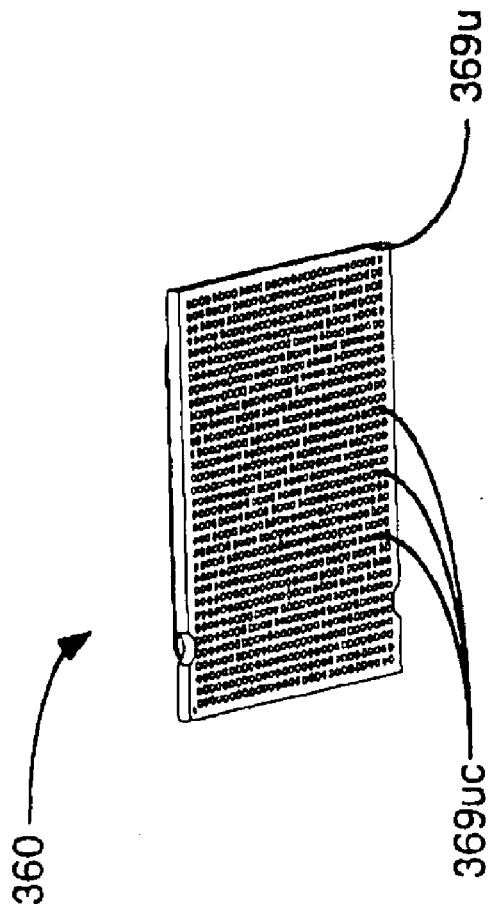
FIGS. 3d, 3e and 3f depict placement of electrical contacts in the embodiment of FIGS. 3a, 3b and 3c.
Figure 3E:
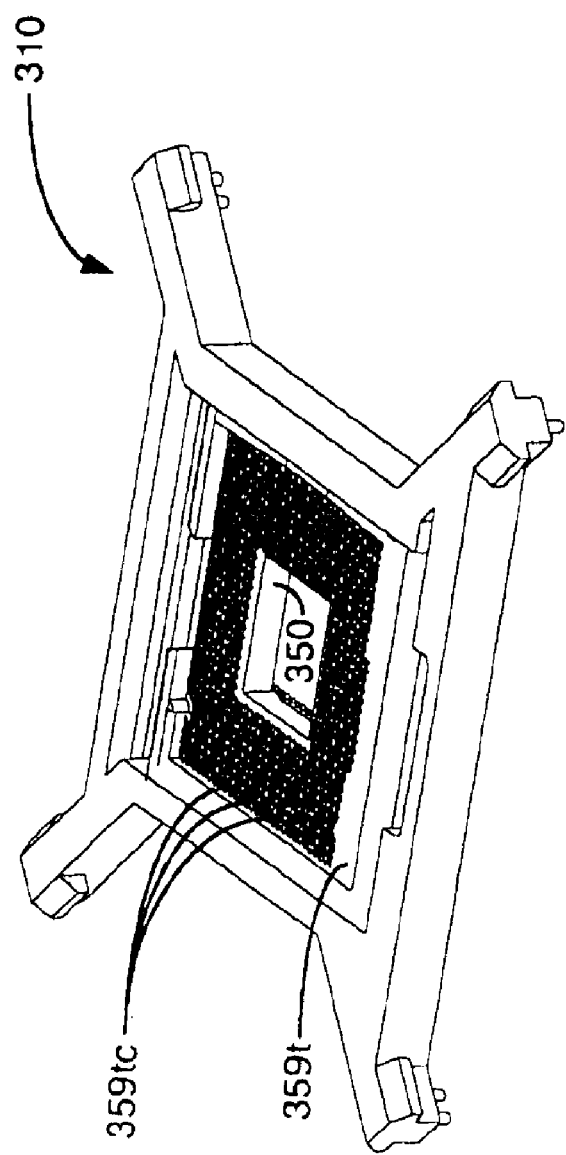
Figure 3F:
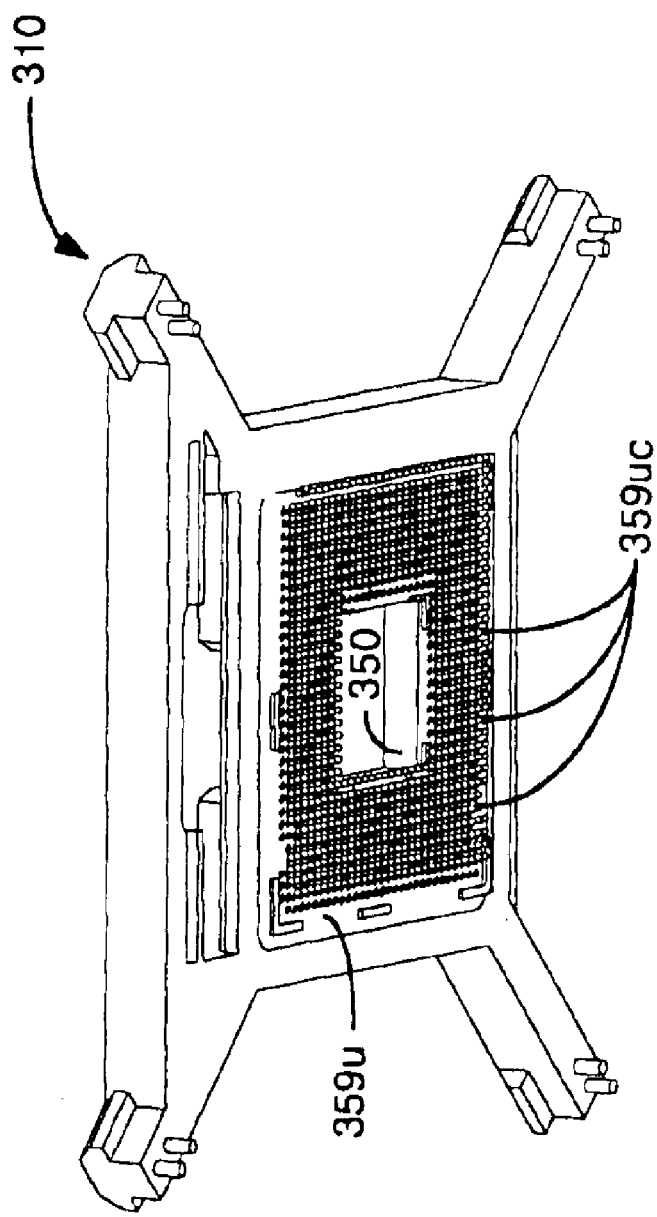

FIGS. 3a–c depict the removable retaining of an IC by an embodiment, and FIGS. 3d–f depict the placement of electrical contacts. As an aid to understanding and relating what is depicted in FIGS. 3a–f to what is depicted in FIGS. 1 and 2a–c, the latter two digits of labels 3xx of FIGS. 3a–f are meant to generally correspond to the latter two digits of labels 1xx of FIG. 1 and labels 2xx of FIGS. 2a–c. In a manner not unlike what was depicted in FIGS. 1 and 2a–c, retention frame 310, load plate 320 and load lever 330 cooperate to removably retain IC 360 in engagement with socket 350 attached to circuitboard 340.

In FIG. 3a, retention frame 310 has already been attached to circuitboard 340 with load lever 330 already positioned within a lever channel formed within retention frame 310 and between retention frame 310 and circuitboard 340. Socket 350 has already been positioned such that socket 350 is surrounded by the frame portions making up retention frame 310 and attached to circuitboard 340 with contacts, including contacts 359uc, making electrical connections between socket 350 and circuitboard 340. In preparation for being removably retained, IC 360 has been positioned atop and in contact with socket 350 such that contacts 369uc of IC 360 are aligned with contacts 359tc of socket 350. In preparation for removably retaining IC 360, load plate 320 has been positioned such that hinge lip 325 is inserted into hinge channel 315 formed in retention frame 310, thereby creating a hinge between load plate 320 and retention frame 310.

In FIG. 3b, load plate 320 is pivoted on the aforementioned hinge towards retention frame 310 and covering both IC 360 and socket 350 such that load points 324 of load plate 320 engage load points 364 of IC 360. This pivoting of load plate 320 also brings load point 326 into the vicinity of load point channel 316 where it load point 326 may be engaged by load point 336 protruding through load point channel 316 from where load lever resides within the lever channel to which load point channel 316 connects.

In FIG. 3c, load lever 330 is pivoted such that load point 336 now engages load point 326 by pivoting of lever handle 338 towards circuitboard 340 and such that lever handle 338 engages lever catch 318. Lever catch 318 aids in holding load lever 330 in place, thereby aiding in the maintenance of force through load point 336 to press load point 326 into load point channel 316 and towards circuitboard 340. With this pivoting of load lever 330, IC 360 is removably retained in engagement with socket 350 such that contacts 369uc of IC 360 now engage contacts 359tc of socket 350 to form electrical connections therebetween. The contacts 359tc of socket 350 that engage the contacts 369uc of IC 360 are electrically connected with the contacts 359uc of socket 350 that engage the contacts of circuitboard 340, thereby forming electrical connections between the contacts 369uc of IC 360 and circuitboard 340 through socket 350.

Figure 4:
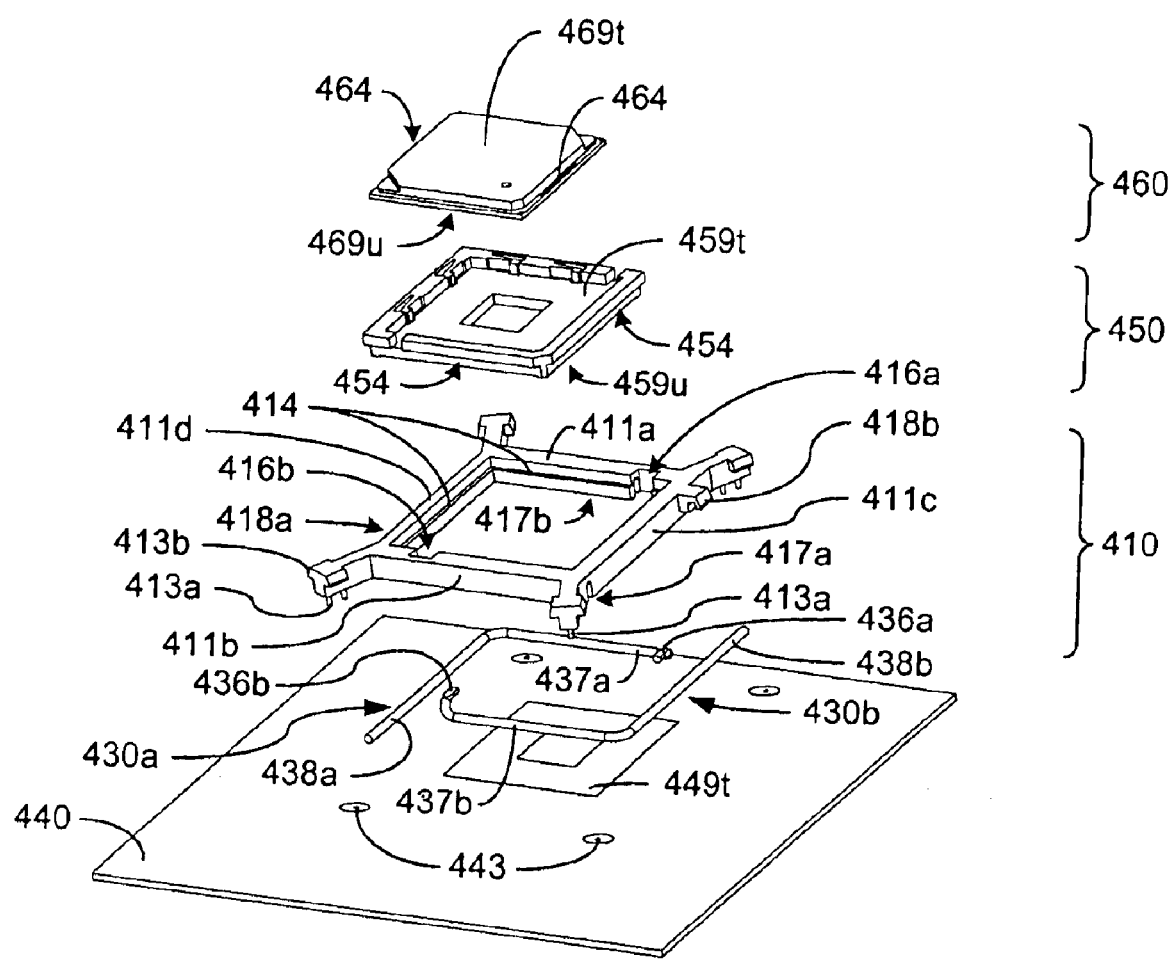
FIG. 4 depicts another embodiment of an assembly of an IC and a socket.

FIG. 4 depicts another embodiment of an assembly of an IC to a socket. Assembly 400 is made up of retention frame 410, load levers 430a and 430b, circuitboard 440, socket 450 and IC 460. Retention frame 410 and load levers 430a and 430b cooperate to forcibly press together IC 460 and socket 450 so as to press contacts on topside 459t of socket 450 into engagement with contacts on underside 469u of IC 460.

In preparation for assembly, load levers 430a–b are positioned between retention frame 410 and circuitboard 440, aligning axle portions 437a and 437b of load levers 430a and 430b, respectively, with a load lever channels 417a and 417b formed in frame portions 411a and 411b of retention frame 410, respectively, and aligning load points 436a and 436b of levers 430a and 430b to ultimately protrude through load point channels 416a and 416b formed through frame portions 411a and 411b, respectively, of retention frame 410. Retention frame 410 attaches to circuitboard 440 via fasteners 413a of retention frame 410 engaging mounting holes 443 of circuitboard 440, and trapping load levers 430a and 430b within load lever channels 417a and 417b of retention frame 410 and between retention frame 410 and circuitboard 440.

Socket 450 attaches to circuitboard 440 via any of a number of known techniques for soldering contacts on underside 459u of socket 450 to contacts on socket surface location 449t of circuitboard 440. As socket 450 is attached to circuitboard 440, socket 450 is positioned amidst the open area formed through the middle of retention frame 410 that is outlined by frame portions 411a through 411d, and ledges 454 of socket 450 are positioned opposite ledges 414 of retention frame 410.

IC 460 is positioned so as to align contacts on underside 469u of IC 460 with corresponding contacts on topside 459t of socket 450. This alignment and allows load points 464 surrounding raised topside 469t of IC 460 to be in a position in the vicinity of load point channels 416a and 416b so as to allow load points 436a and 436b of load levers 430a and 430b to ultimately engage one each of load points 464.

Load levers 430a and 430b are pivoted about the axes of axle portions 437a and 437b of load levers 430a and 430b, respectively, causing load points 436a and 436b to engage one each load points 464 and so that lever handles 438a and 438b engage lever catches 418a and 418b, respectively, of socket 410. The engagements between ledges 454 and 414, and between load points 436a and 436b with load points 464 cooperate to exert forces normal to both underside 469u of IC 460 and topside 459t that press underside 469u against topside 459t such that contacts on both underside 469u and topside 459t are pressed into engagement with each other, forming electrical connections therebetween. Raised topside 469t is raised relative to load points 464 such that raised topside 469t protrudes above load points 436a and 436b of load levers 430a and 430b have been pivoted to cause load points 436a and 436b to engage load points 464. In various embodiments, the actual circuitry of IC 460 is located on a surface of a ceramic die within the package of IC 460 at a location generally centered behind raised topside 469t, and the placement of load points 464 at locations surrounding raised topside 469t aid in avoiding the application of force exerted by load levers 430a and 430b against topside 469t (which may be more fragile than load points 464), thereby avoiding the possibility of damaging the circuitry of IC 460. The protrusion of topside 469t beyond load points 436a and 436b also allows a heatsink or other cooling device to be positioned in contact with topside 469t and clear of any obstruction that my be posed by load levers 430a and 430b such that heat generated by circuitry within IC 460 may be conducted away through topside 469t.

The positioning of ledges 454 and 414 on all sides of socket 450 where socket 450 is surrounded by retention frame 414 allows retention frame 410 to stiffen socket 450 and thereby aid in preventing socket 450 from bending or otherwise curving in reaction to the forces used in pressing socket 450 and IC 460 together. Stiffening socket 450 aids in ensuring that the forces pressing underside 469u of IC 460 against topside 459t of socket 450 are distributed evenly across underside 469u and topside 459t so that all pins on underside 469u are being pressed against corresponding pins on topside 459t with equal amounts of force. The stiffening of socket 450 may be further aided by the attachment of retention frame 410 to circuitboard 440 via fasteners 413a engaging mounting holes 443, allowing retention frame 410 to be strengthened against bending, itself, although the degree to which retention frame 410 draws strength from this attachment to circuitboard 440 may have to be limited to ensure that not so much force is transmitted to the attachment between fasteners 413a and mounting holes 443 that creeping failures are caused to occur such that the ability of fasteners 413a to aid in supporting the attachment of cooling devices to fasteners 413b is compromised.

In some embodiments, retention frame 410 may be designed with physical stops in the vicinities of load point channels 416a and 416b to limit the degree to which load points 436a and 436b may be pivoted towards socket 450 and into engagement with load points 464, and thereby limit the force exerted by load levers 430a and 430b at load points 436a and 436b against IC 460 at load points 464 in order to protect against inadvertent damage to IC 460. In some embodiments, load levers 430a and 430b may be fabricated in such a way that there is sufficient flexibility in the material of load levers 430a and 430b such that load points 436a and 436b may flex to some limited degree relative to load handles 438a and 438b on the common axes of axle portions 437a and 437b, respectively, in order to provide some wider tolerances to accommodate instances where one or both of load points 436a and 436b engage load points 464 and has effectively already pressed IC 460 as far as IC 460 either could or should go before one or the other of load handles 438a and 438b have yet engaged lever catches 418a and 418b, respectively.

Figure 5:
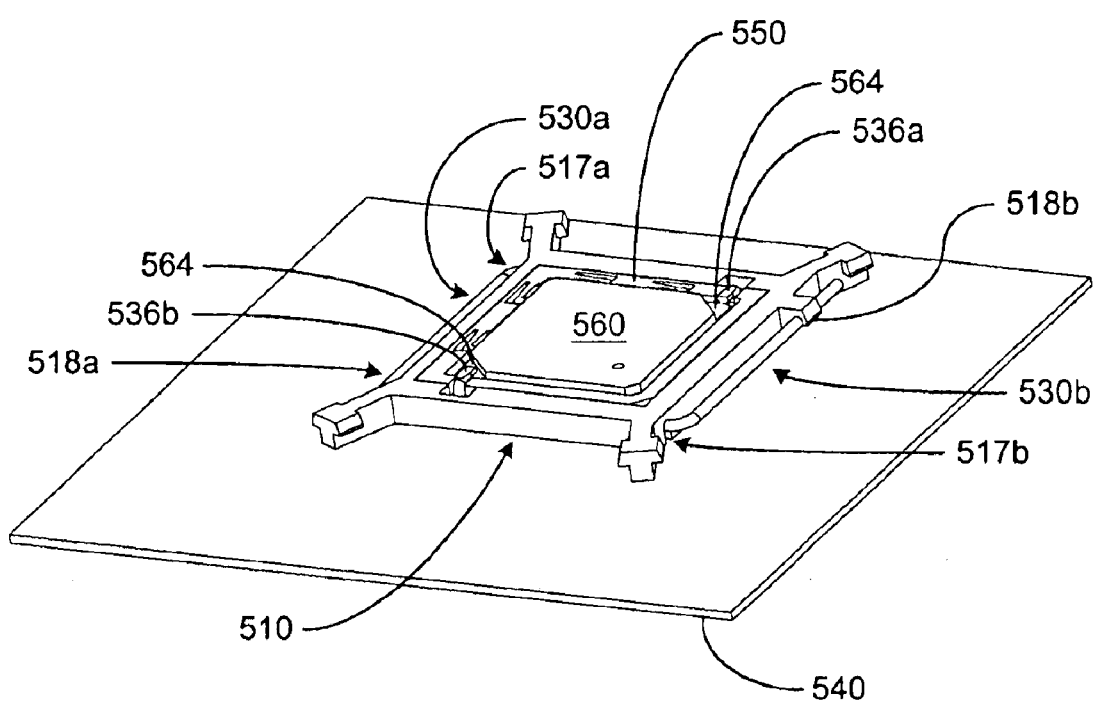
FIG. 5 depicts another embodiment of IC retention hardware.

FIG. 5 depicts the removable retaining of an IC by an embodiment. As an aid to understanding and relating what is depicted in FIG. 5 to what is depicted in FIG. 4, the latter two digits of labels 5xx of FIG. 5 are meant to generally correspond to the latter two digits of labels 4xx of FIG. 4. In a manner not unlike what was depicted in FIG. 4, retention frame 510 and load levers 530a and 530b cooperate to removably retain IC 560 in engagement with socket 550 attached to circuitboard 540.

Retention frame 510 has already been attached to circuitboard 540 with load levers 530a and 530b already positioned within lever channels 517a and 517b, respectively, formed within retention frame 510 and between retention frame 510 and circuitboard 540. Socket 550 has already been positioned such that socket 550 is surrounded by the frame portions making up retention frame 510 and attached to circuitboard 540 with contacts making electrical connections between socket 550 and circuitboard 540. IC 560 has been positioned atop and in contact with socket 550 such that contacts of IC 560 are aligned with contacts of socket 550.

Load levers 530a and 530b are pivoted relative to retention frame 510 and towards circuitboard 540 such that load points 536a and 536b of load levers 530a and 530b, respectively, engage each of load points 564 of IC 560, and such that lever handles 538a and 538b engage lever catches 518a and 518b, respectively. Lever catches 518a and 518b aid in holding load levers 530a and 530b, respectively, in place, thereby aiding in the maintenance of force through load point 536a and 536b to press on each of load points 564 towards circuitboard 540. With this pivoting of load levers 530a and 530b, IC 560 is removably retained in engagement with socket 550 such that contacts of IC 560 now engage contacts of socket 550 to form electrical connections therebetween. The contacts of socket 550 that engage the contacts of IC 560 are electrically connected with the contacts of socket 550 that engage the contacts of circuitboard 540, thereby forming electrical connections between the contacts of IC 560 and circuitboard 540 through socket 550.

Figure 6:
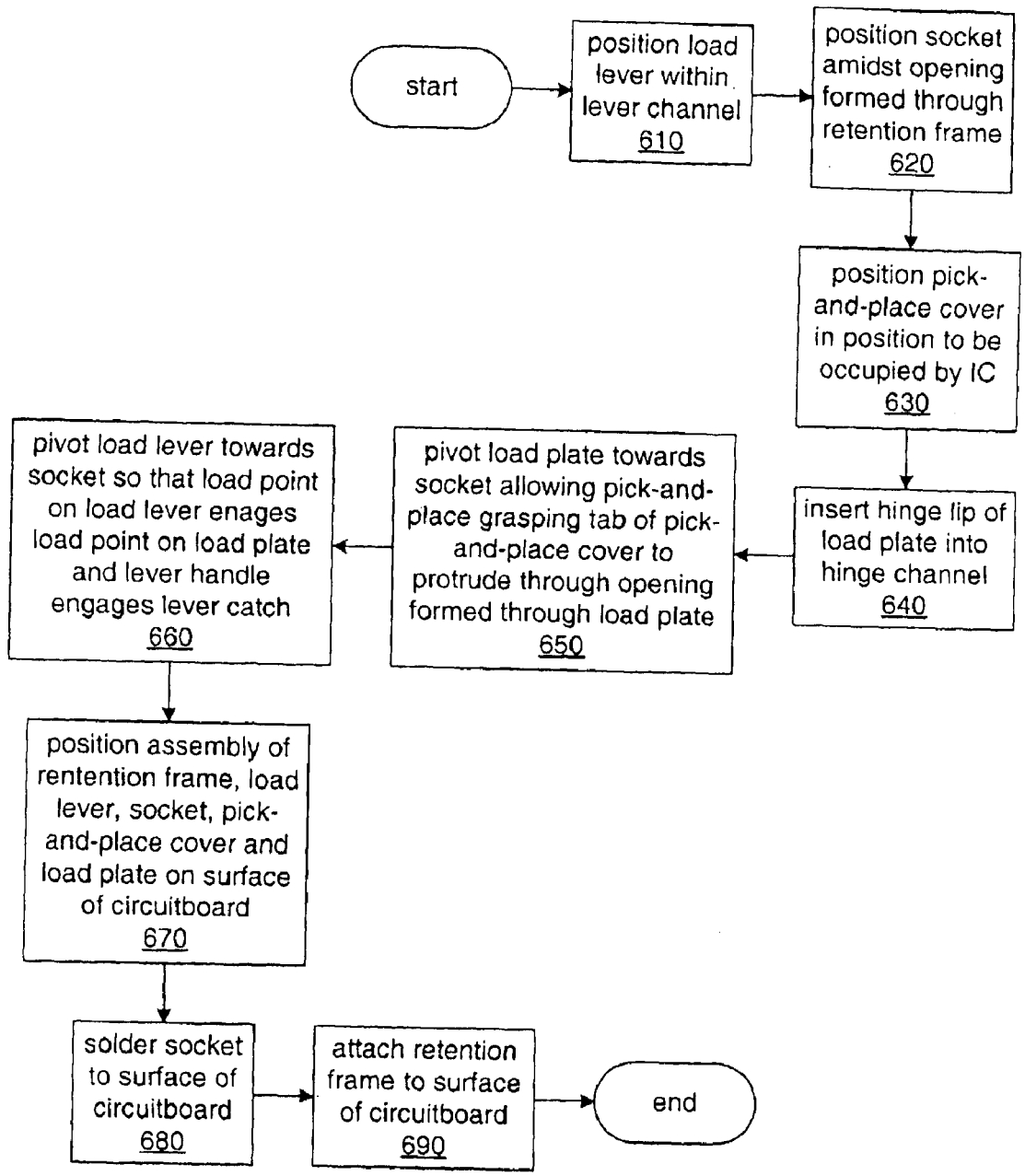
FIG. 6 depicts a flowchart of an embodiment of attaching an assembly to a circuitboard.

FIG. 6 depicts a flowchart of an embodiment of attachment of an assembly to a circuitboard. The load lever of an assembly is positioned within the lever channel of the retention frame of the assembly at 610. At 620, the socket of the assembly is positioned amidst the opening formed through the retention frame. A pick-and-place cover used to allow the assembly to be grasped by a pick-and-place machine for placement on a circuitboard is positioned in contact with the socket at the same location where an IC may later be installed within the assembly at 630. At 640, the hinge lip of a load plate of the assembly is inserted into the hinge channel of the retention frame. The load plate is pivoted on the hinge created by the hinge lip and hinge channel towards the socket while allowing the pick-and-place grasping tab of the pick-and-place cover to protrude through an opening formed through the load plate at 650. At 660, the load lever is pivoted towards the socket so that a load point carried by the load lever engages a load point carried by the load plate, and so that the lever handle of the load lever engages a lever catch carried by the retention frame. The assembly of the retention frame, load lever, socket, pick-and-place cover and load plate is positioned on the surface of a to which the assembly is to be attached at 670. At 680, the socket is soldered to the surface of the circuitboard, and at 690, the retention frame is also attached to the circuitboard using any of a variety of possible fasteners.

Figure 7:
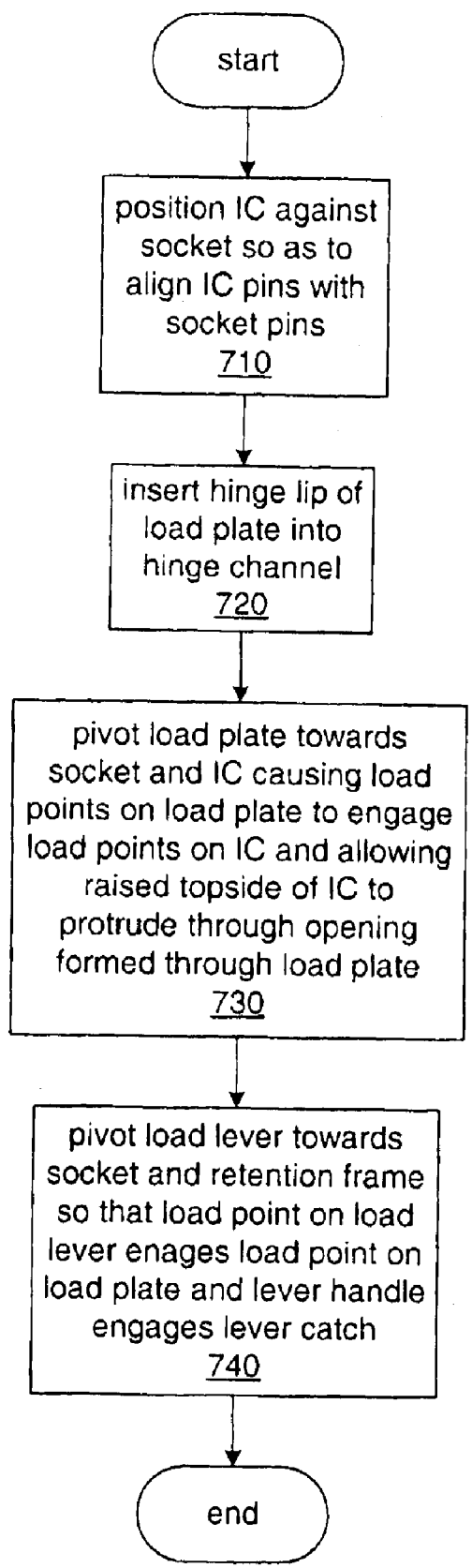
FIG. 7 depicts a flowchart of an embodiment of installing an IC into an assembly.

FIG. 7 depicts a flowchart of an embodiment of installation of an IC into an assembly. At 710, an IC is positioned in contact with a socket of an assembly such that pins carried by the IC are aligned with pins carried by the socket so that they may be pressed together into engagement. At 720, the hinge lip of a load plate of the assembly is inserted into the hinge channel of a retention frame of the assembly that surrounds the socket. At 730, the load plate is pivoted towards the socket and towards the IC (the IC still being aligned with the socket as described, earlier) causing load points on the load plate to engage load points on the IC and allowing a raised topside surface of the IC to protrude through an opening formed through the load plate. At 740, the load lever is pivoted towards the socket and the retention frame so that a load point carried by the load lever engages a load point carried by the load plate, and so that the lever handle of the load lever engages a lever catch carried by the retention frame. This causes the load points of the load plate that are engaging the load points of the IC to press against the load points of the IC. The combination of the engagements between the load points of the load plate and the IC, between the hinge lip of the load plate and the hinge channel of the retention frame, between the load point of the load plate and the load point of the load lever, between the load lever and the lever channel of the retention frame into which the load lever was previously positioned, and between ledges carried by the retention frame and ledges carried by the socket all cooperate together to press the IC against the socket such that pins of the IC that were aligned with pins of the socket to engage those pins of the socket.

Figure 8:
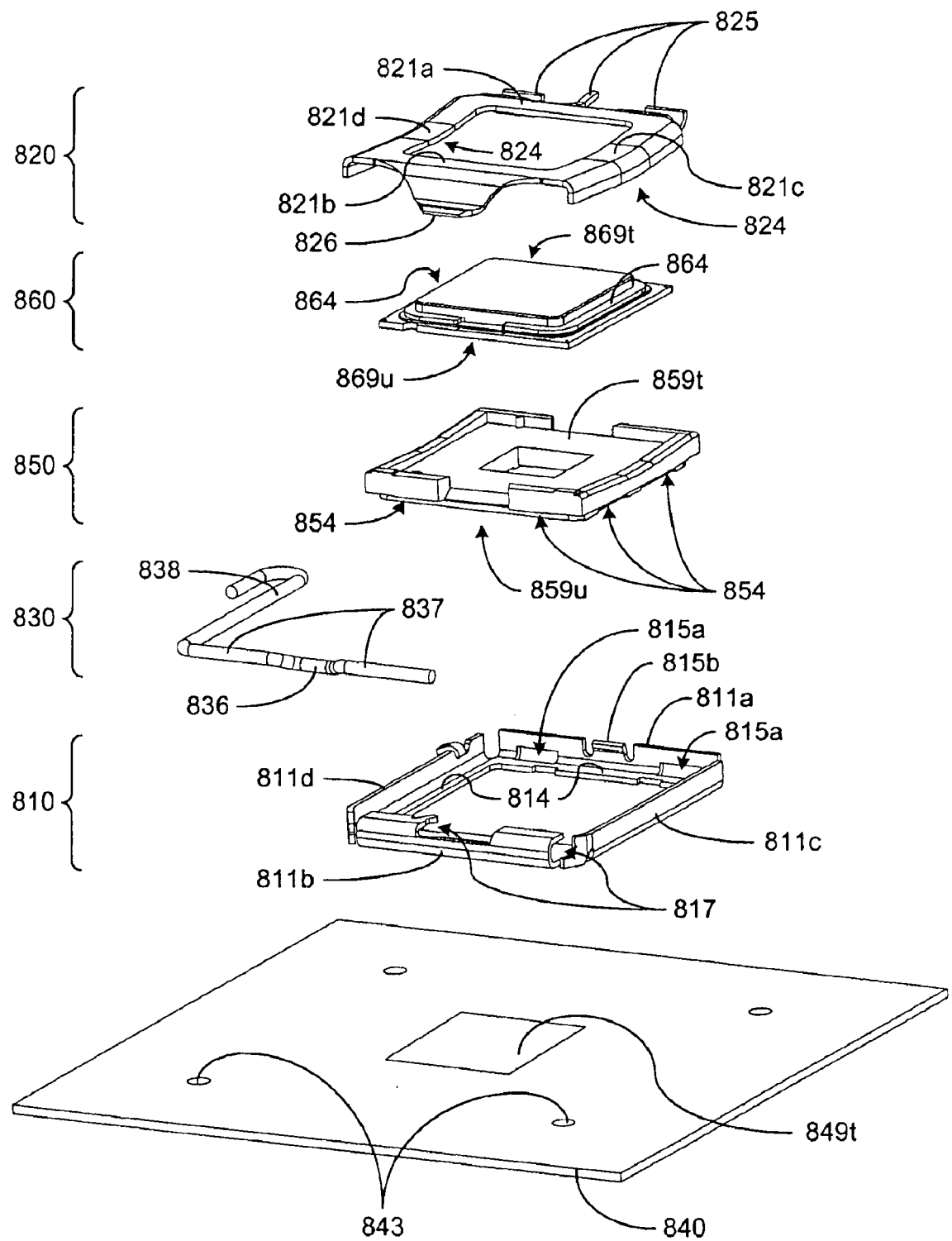
FIG. 8 depicts yet another embodiment of an assembly of an IC and a socket.

FIG. 8 depicts yet another embodiment of an assembly of an IC to a socket. Assembly 800 is made up of retention frame 810, load plate 820, load lever 830, circuitboard 840, socket 850 and IC 860. Retention frame 810, load plate 820 and load lever 830 cooperate to forcibly press together IC 860 and socket 850 so as to press contacts on topside 859t of socket 850 into engagement with contacts on underside 869u of IC 860.

In preparation for assembly, load lever 830 is positioned within lever channel 817 formed in frame portion 811b of retention frame 810, and aligning load point 836 of lever 830 to ultimately protrude through load point channel 816 formed through portion 811b of retention frame 810.

Socket 850 attaches to circuitboard 840 via any of a number of known techniques for soldering contacts on underside 859u of socket 850 to contacts on socket surface location 849t of circuitboard 840. As socket 850 is attached to circuitboard 840, socket 850 is positioned amidst the open area formed through the middle of retention frame 810 that is outlined by frame portions 811a through 811d, and ledges 854 of socket 850 are positioned opposite ledges 814 of retention frame 810.

IC 860 is positioned between load plate 820 and socket 850, aligning contacts on underside 869u of IC 860 with corresponding contacts on topside 859t of socket 850, and aligning raised topside 869t of IC 860 with the opening formed through load plate 820 that is outlined by plate portions 821a through 821d. Load plate 820 and IC 860 are also aligned to allow load points 824 on plate portions 821c and 821d of load plate 820 to engage load points 864 surrounding raised topside 869t of IC 860. Raised topside 869t is raised relative to load points 864 such that raised topside 869t protrudes through the opening formed through load plate 820 when load points 824 and 864 are engaged in contact with each other. In various embodiments, the actual circuitry of IC 860 is located on a surface of a ceramic die within the package of IC 860 at a location generally centered behind raised topside 869t, and the placement of load points 864 at locations surrounding raised topside 869t aid in avoiding the application of force exerted by load plate 820 against topside 869t (which may be more fragile than load points 864), thereby avoiding the possibility of damaging the circuitry of IC 860. The protrusion of topside 869t through the opening formed through load plate 820 also allows a heatsink or other cooling device to be positioned in contact with topside 869t and clear of any obstruction that my be posed by load plate 820 such that heat generated by circuitry within IC 860 may be conducted away through topside 869t. Load plate 820 attaches to retention frame 810, in part, via hinge tabs 825 on plate portion 821a of load plate 820 engaging hinge channels 815a and hinge tab 815b provided by frame portion 811a of retention frame 810, and trapping IC 660 between load plate 820 and socket 650.

Load lever 830 is pivoted about the common axis of axle portions 837 of load lever 830, causing load point 836 of load lever 830 to engage load point 826 on plate portion 821b of load plate 820 and so that lever handle 838 engages lever catch 818 of socket 810. The engagements between hinge lip 825 and hinge channel 815, between load point 836 and load point 826, between ledges 854 and 814, and between load points 824 and load points 864 cooperate to exert forces normal to both underside 869u of IC 860 and topside 859t that press underside 869u against topside 859t such that contacts on both underside 869u and topside 859t are pressed into engagement with each other, forming electrical connections therebetween.

The positioning of ledges 854 and 814 on all sides of socket 850 where socket 850 is surrounded by retention frame 814 allows retention frame 810 to stiffen socket 850 and thereby aid in preventing socket 850 from bending or otherwise curving in reaction to the forces used in pressing socket 850 and IC 860 together. Retention frame 810 must be able to stiffen socket 850 without reinforcement from circuitboard 840, since retention frame 810 may not actually be attached to circuitboard 840. In some embodiments, retention frame 810 is fabricated from a single piece of sheet metal. However, as those skilled in the art will immediately appreciate, other embodiments are possible in which retention frame 610 is formed of cast metal, composite, ceramic, plastic, etc. The material used in creating retention frame 810 must be capable of supporting the various engagements described above between retention frame 680 and socket 850, load plate 820 and load lever 830. This support must be possible without failures in which either the pressure between IC 860 and socket 850 or the stiffening support provided to socket 850 would be allowed to relax before the expected end of the useful life of IC 860 or of the product into which circuitboard 840 is installed.

Figure 9A:
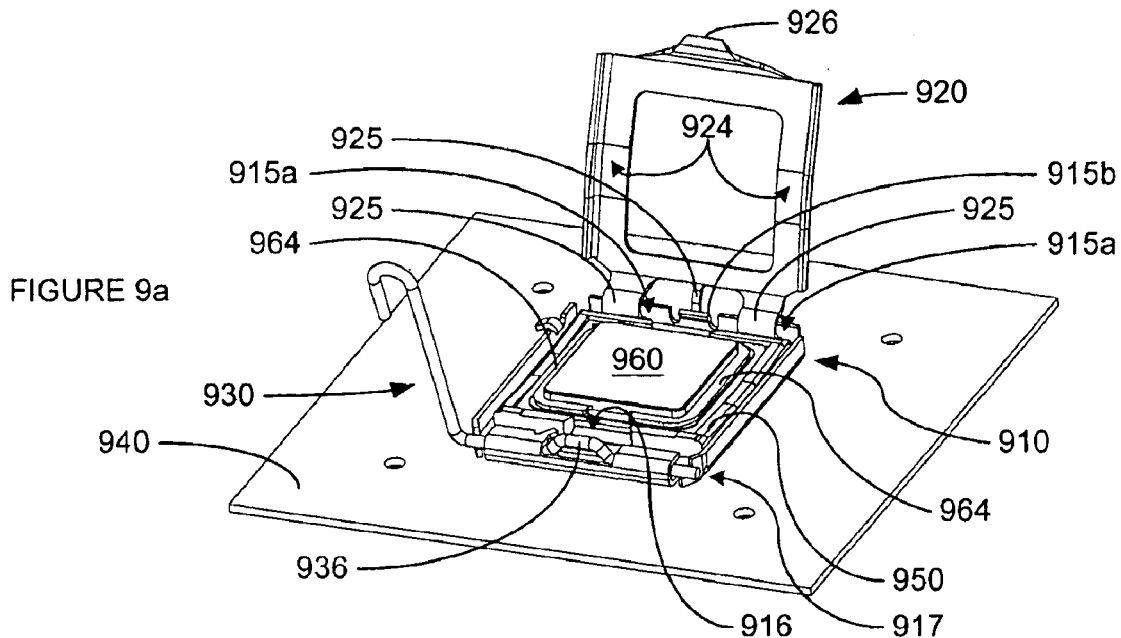
FIGS. 9a, 9b and 9c depict installing an IC in a socket in yet another embodiment.
Figure 9B:
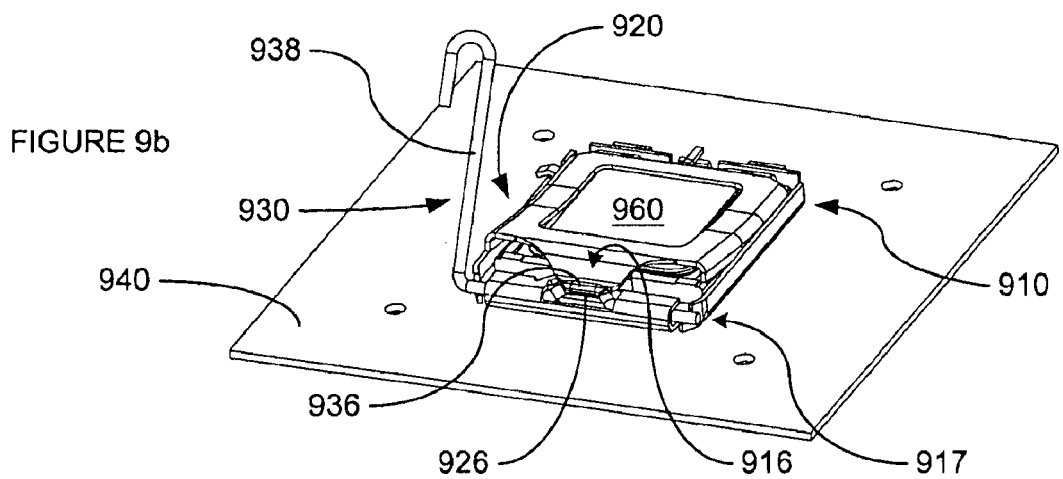
Figure 9C:
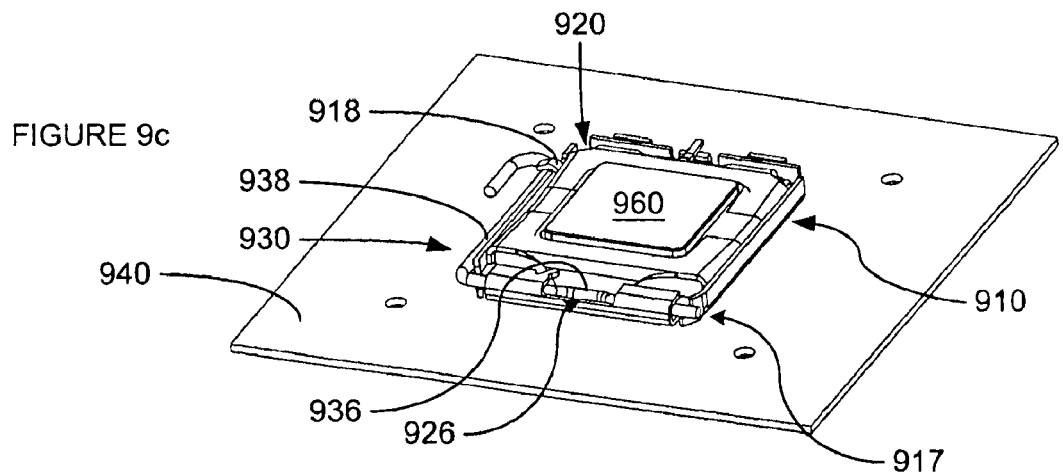
Figure 9D:
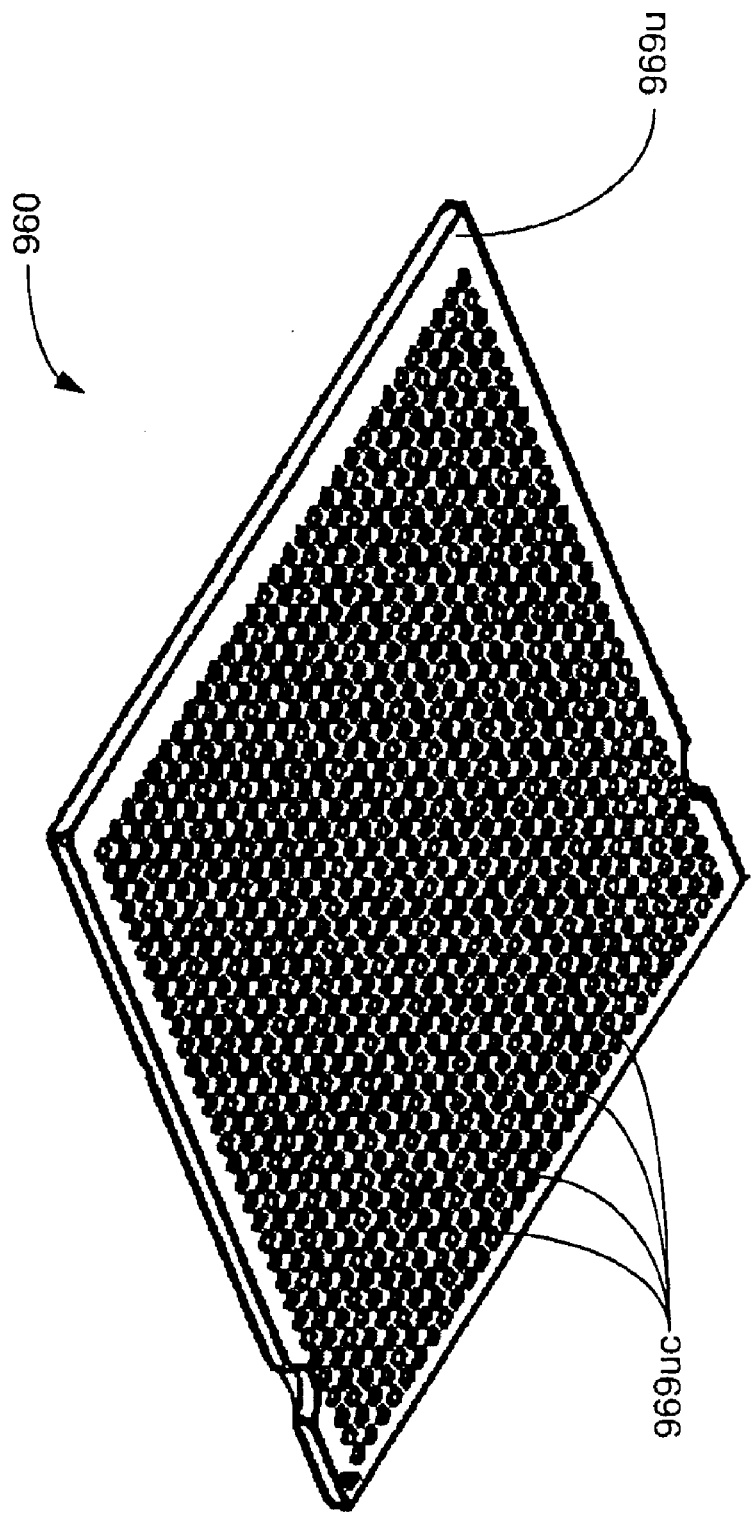
Figure 9E:
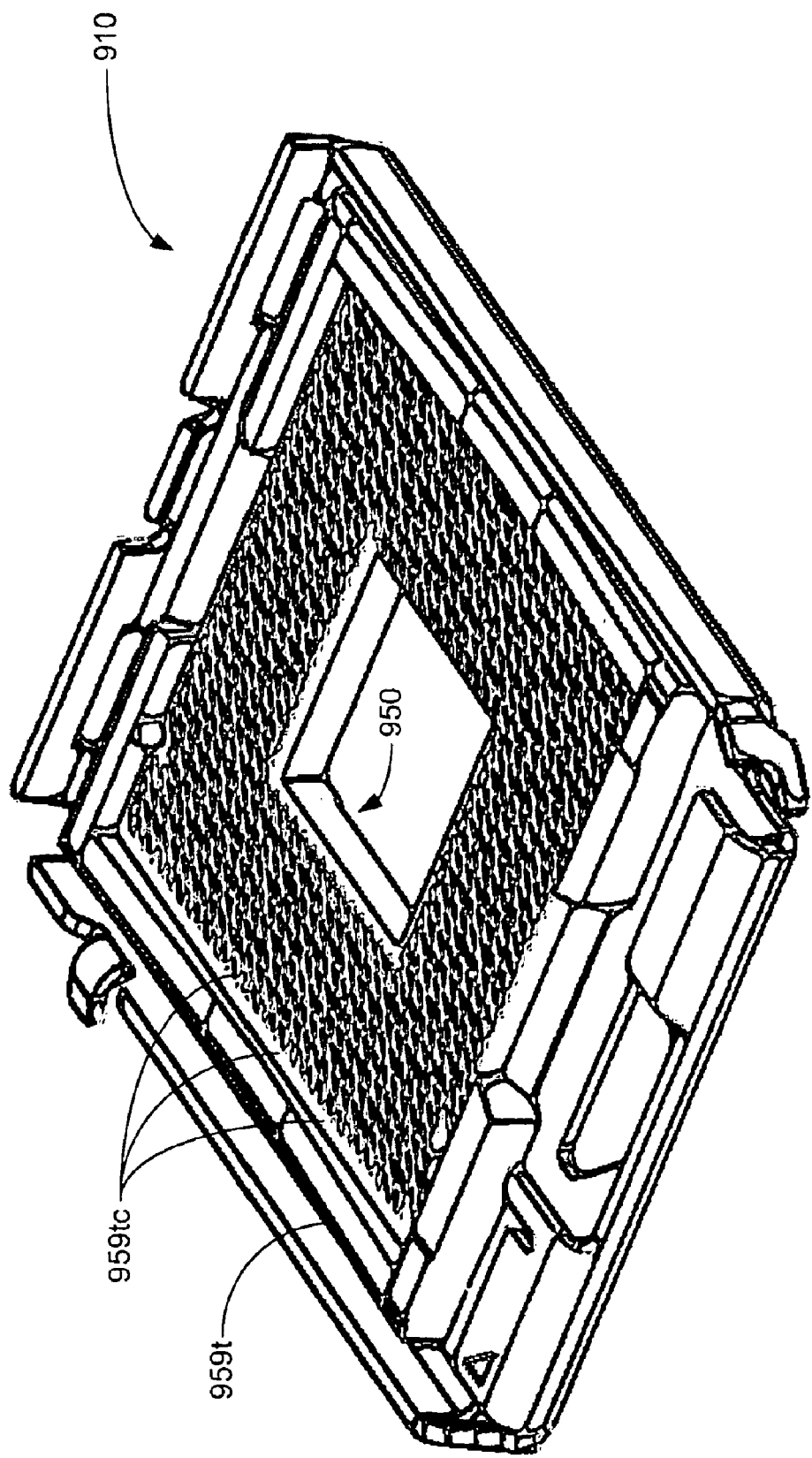

FIGS. 9a–c depict the removable retaining of an IC by yet another embodiment, and FIGS. 9d–f depict the placement of electrical contacts. As an aid to understanding and relating what is depicted in FIGS. 9a–f to what is depicted in FIG. 8, the latter two digits of labels 9xx of FIGS. 9a–f are meant to generally correspond to the latter two digits of labels 8xx of FIG. 8. In a manner not unlike what was depicted in FIG. 8, retention frame 910, load plate 920 and load lever 930 cooperate to removably retain IC 960 in engagement with socket 950 attached to circuitboard 940.

In FIG. 9a, load lever 930 already positioned within lever channel 917 formed within retention frame 910. Socket 950 has already been positioned such that socket 950 is surrounded by the frame portions making up retention frame 910 and socket 950 has already attached to circuitboard 940 with contacts, including contacts 959uc, making electrical connections between socket 950 and circuitboard 940. In preparation for being removably retained, IC 960 has been positioned atop and in contact with socket 950 such that contacts 969uc of IC 960 are aligned with contacts 959tc of socket 950. In preparation for removably retaining IC 960, load plate 920 has been positioned such that hinge tabs 925 have engaged hinge channels 915a and hinge tab 915b provided by retention frame 910, thereby hooking load plate 920 on retention frame 910 and creating a hinge between load plate 920 and retention frame 910 that allows load plate 920 to pivot relative to retention frame 910.

In FIG. 9b, load plate 920 is pivoted in the manner just described towards retention frame 910 and covering both IC 960 and socket 950 such that load points 924 of load plate 920 engage load points 964 of IC 960. This pivoting of load plate 920 also brings load point 926 into the vicinity of load point channel 916 where it load point 926 may be engaged by load point 936 protruding through load point channel 916 from where load lever resides within the lever channel to which load point channel 916 connects.

In FIG. 9c, load lever 930 is pivoted such that load point 936 now engages load point 926 by pivoting of lever handle 938 towards circuitboard 940 and such that lever handle 938 engages lever catch 918. Lever catch 918 aids in holding load lever 930 in place, thereby aiding in the maintenance of force through load point 936 to press load point 926 into load point channel 916 and towards circuitboard 940. With this pivoting of load lever 930, IC 960 is removably retained in engagement with socket 950 such that contacts 969uc of IC 960 now engage contacts 959tc of socket 950 to form electrical connections therebetween. The contacts 959tc of socket 950 that engage the contacts 969uc of IC 960 are electrically connected with the contacts 959uc of socket 950 that engage the contacts of circuitboard 940, thereby forming electrical connections between the contacts 969uc of IC 960 and circuitboard 940 through socket 950.

Figure 10:
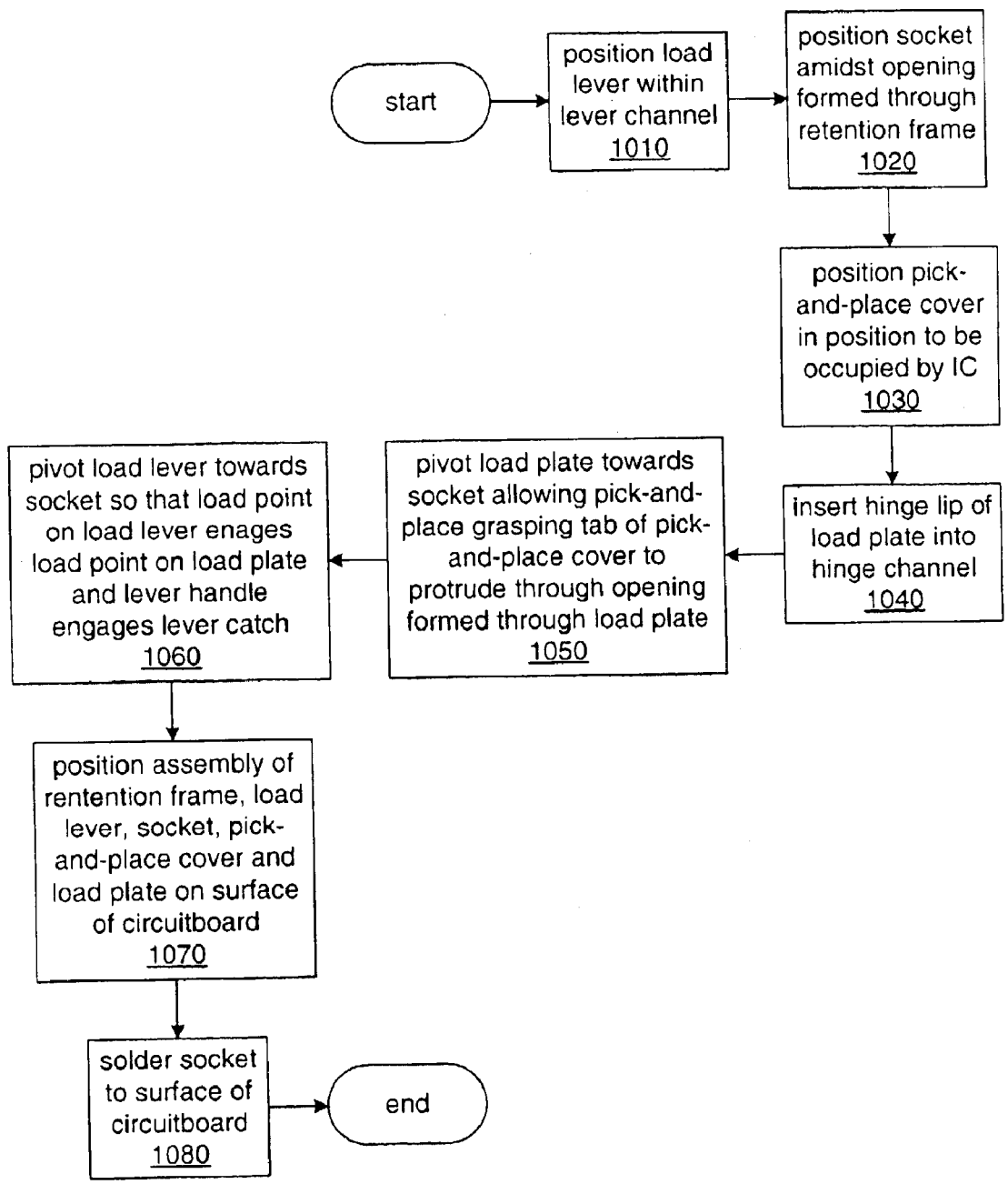
FIG. 10 depicts a flowchart of another embodiment of attaching an assembly to a circuitboard.

FIG. 10 depicts a flowchart of another embodiment of attachment of an assembly to a circuitboard. The load lever of an assembly is positioned within the lever channel of the retention frame of the assembly at 610. At 620, the socket of the assembly is positioned amidst the opening formed through the retention frame. A pick-and-place cover used to allow the assembly to be grasped by a pick-and-place machine for placement on a circuitboard is positioned in contact with the socket at the same location where an IC may later be installed within the assembly at 630. At 640, the hinge lip of a load plate of the assembly is inserted into the hinge channel of the retention frame. The load plate is pivoted on the hinge created by the hinge lip and hinge channel towards the socket while allowing the pick-and-place grasping tab of the pick-and-place cover to protrude through an opening formed through the load plate at 650. At 660, the load lever is pivoted towards the socket so that a load point carried by the load lever engages a load point carried by the load plate, and so that the lever handle of the load lever engages a lever catch carried by the retention frame. The assembly of the retention frame, load lever, socket, pick-and-place cover and load plate is positioned on the surface of a to which the assembly is to be attached at 670. At 680, the socket is soldered to the surface of the circuitboard.

Although the embodiments have been discussed in reference to the mounting of an IC to a circuitboard through a socket, various components/devices other than an IC may be mounted to various surfaces other than a PCB by way of the present invention, as those skilled in the art will readily appreciate.

The teachings herein have been exemplified in conjunction with the preferred embodiment. Numerous alternatives, modifications, variations and uses will be apparent to those skilled in the art in light of the foregoing description. It will be understood by those skilled in the art that the invention as hereinafter claimed may be practiced in support of a wide variety of devices using a wide variety of packages including, but not limited to, pin grid array, land grid array and ball grid array.

What is claimed is:

1. An apparatus comprising:
    a retention frame;
    a socket carrying a first set of contacts to engage contacts of an IC and positioned within the retention frame such that portions of the frame surround the socket and such that ledges carried by the socket are positioned opposite ledges carried by the retention frame;
    a load plate pivotally coupled to the retention frame;
    a load lever pivotally coupled to the retention frame and having a load point to engage a load point carried by the load plate to retain and press the load plate towards the retention frame, while also causing the ledges carried by the retention frame to engage the ledges carried by the socket, thereby pressing contacts carried by the package of an IC against the first set of contacts carried by the socket into engagement to create electrical connections therebetween.

2. The apparatus of claim 1, wherein the contacts carried by the socket are configured to engage contacts carried by an IC having a land grid array package.

3. The apparatus of claim 1, wherein the first set of contacts carried by the socket are each individually electrically connected to one of a second set of contacts carried by the socket, wherein the second set of contacts is configured to engage contacts carried by a circuitboard.

4. The apparatus of claim 1, wherein the socket is mounted to a circuitboard by way of the soldering of a second set of contacts carried by the socket to a set of contacts carried by the circuitboard, and wherein the circuitboard provides a plurality of mounting holes by which fasteners may be used to attach a cooling device and position the cooling device so as to engage a topside surface of an IC removably retained in engagement with the socket to cool the IC.

5. The apparatus of claim 1, wherein the load plate carries a pair of load points to engage corresponding load points on the surface of an IC package to press the IC against the socket.

6. An apparatus comprising:

a circuitboard;

a retention frame;

a socket positioned within the retention frame such that portions of the retention frame surround the socket and ledges carried by the retention frame are positioned opposite ledges carried by the socket, wherein the socket is also attached to the first surface of the circuitboard at least in part by way of a first set of electrical contacts carried by the socket being soldered to a set of contacts carried by the circuitboard such that the socket aids in retaining the retention frame in close proximity to the circuitboard through engagement between the ledges carried by both the socket and the retention frame, and wherein the socket carries a second set of electrical contacts of which each is individually electrically connected to one of the first set of contacts; and a load lever pivotally coupled to the retention frame and having a load point to engage a load plate to retain and press the load plate towards the retention frame to press contacts carried by the package of an IC against a second set of contacts carried by the socket into engagement to create electrical connections therebetween.

7. The apparatus of claim 6, wherein the circuitboard has a plurality of holes formed therethrough that surround the socket and provide locations at which fasteners may be used to mount a cooling device to cool an IC having a package with contacts in engagement with the second set of contacts of the socket may be attached to position the cooling device in engagement with a surface of the package of the IC.

8. A method comprising:

positioning a load lever within a load lever channel formed in a portion of a retention frame such that the load lever may be pivoted relative to the retention frame;

positioning a socket within the retention frame such that portions of the retention frame surround the socket and such that ledges carried by the retention frame are positioned opposite to ledges carried by the socket;

attaching the socket to the circuitboard such that a first set of contacts carried by the socket are engaged with a set of contacts carried by the circuitboard forming a plurality of electrical connections therebetween and such that the ledges of the socket engage the ledges of the retention frame to retain the retention frame in close proximity to the circuitboard;

inserting a hinge lip of a load plate into a load channel provided by the retention frame;

placing an IC over the socket such that contacts carried by the package of the IC are aligned for engagement with a second set of contacts carried by the socket, wherein the second set of contacts carried by the socket are each individually electrically connected to one of the first set of contacts carried by the socket;

pivoting the load plate relative to the retention frame such that at least a portion of the load plate is pressed into engaging at least a portion of a surface of the package of the IC tending to press the package of the IC into engagement with the socket such that the contacts carried by the package of the IC tend to be pressed into engagement with the second set of contacts carried by the socket; and pivoting the load lever relative to the retention frame such that at least one load point of the load lever engages at least one load point of the load plate to press the load plate towards the package of the IC so as to further press the package of the IC into engagement with the socket such that the contacts carried by the package of the IC are further pressed into engagement with the second set of contacts carried by the socket.

9. The method of claim 8, further comprising forming a plurality of holes through the circuitboard that surround the socket and provide locations at which fasteners may be used to mount a cooling device in engagement with a surface of the package of the IC to cool the IC while its contacts are in engagement with the second set of contacts of the socket.

* * * * *